(12) United States Patent
Bae et al.

(10) Patent No.: US 9,902,873 B2
(45) Date of Patent: Feb. 27, 2018

(54) COMPOSITION FOR FORMING SILICA BASED LAYER, AND METHOD FOR MANUFACTURING SILICA BASED LAYER

(71) Applicant: SAMSUNG SDI CO., LTD., Yongin-si, Gyeonggi-do (KR)

(72) Inventors: Jin-Hee Bae, Suwon-si (KR); Taek-Soo Kwak, Suwon-si (KR); Han-Song Lee, Suwon-si (KR); Youn-Jin Cho, Suwon-si (KR); Byeong-Gyu Hwang, Suwon-si (KR); Bo-Sun Kim, Suwon-si (KR); Sae-Mi Park, Suwon-si (KR); Eun-Su Park, Suwon-si (KR); Jin-Woo Seo, Suwon-si (KR); Wan-Hee Lim, Suwon-si (KR); Jun-Young Jang, Suwon-si (KR); Kwen-Woo Han, Suwon-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 103 days.

(21) Appl. No.: 14/561,996

(22) Filed: Dec. 5, 2014

(65) Prior Publication Data
US 2015/0337168 A1    Nov. 26, 2015

(30) Foreign Application Priority Data
May 26, 2014    (KR) .................. 10-2014-0063293

(51) Int. Cl.
*C08G 77/12*    (2006.01)
*C09D 183/04*    (2006.01)
*C09D 183/16*    (2006.01)
*C09D 183/02*    (2006.01)
*C23C 18/12*    (2006.01)
*H01L 21/02*    (2006.01)
*C08G 77/60*    (2006.01)
*C08G 77/26*    (2006.01)
*C08G 77/54*    (2006.01)
*H01L 49/02*    (2006.01)

(52) U.S. Cl.
CPC ......... *C09D 183/04* (2013.01); *C09D 183/02* (2013.01); *C09D 183/16* (2013.01); *C23C 18/122* (2013.01); *C23C 18/1212* (2013.01); *C23C 18/1275* (2013.01); *C23C 18/1283* (2013.01); *H01L 21/02164* (2013.01); *H01L 21/02216* (2013.01); *H01L 21/02222* (2013.01); *H01L 21/02282* (2013.01); *H01L 21/02326* (2013.01); *H01L 21/02337* (2013.01); *C08G 77/12* (2013.01); *C08G 77/26* (2013.01); *C08G 77/54* (2013.01); *C08G 77/60* (2013.01); *H01L 28/90* (2013.01)

(58) Field of Classification Search
CPC ........ C08G 77/26; C08G 77/12; C08G 77/54; C08G 77/60
USPC ...................................... 528/31, 38
See application file for complete search history.

(56) References Cited

U.S. PATENT DOCUMENTS

| 6,011,167 A | 1/2000 | Tashiro et al. | |
|---|---|---|---|
| 2008/0061398 A1* | 3/2008 | Nagura | H01L 21/76224 257/510 |
| 2009/0286086 A1* | 11/2009 | Dierdorf | C09D 183/16 428/412 |
| 2011/0183134 A1* | 7/2011 | Bulluck | C08L 83/16 428/220 |
| 2012/0164382 A1* | 6/2012 | Yun | H01L 21/02164 428/141 |
| 2013/0017662 A1* | 1/2013 | Park | C08G 77/62 438/381 |

FOREIGN PATENT DOCUMENTS

| CN | 1576297 A | 2/2005 |
|---|---|---|
| CN | 102143990 A | 8/2011 |
| CN | 102569060 A | 7/2012 |
| CN | 102874813 A | 1/2013 |
| JP | 10-046108 A | 2/1998 |
| JP | 10-194826 A | 7/1998 |
| JP | 2001-308090 A | 11/2001 |
| KR | 10-1999-0087278 A | 12/1999 |
| KR | 10-2008-0094055 A | 10/2008 |
| KR | 10-2011-0062158 A | 6/2011 |
| KR | 10-2012-0071311 A | 7/2012 |
| KR | 10-2012-0080383 A | 7/2012 |
| KR | 10-1243339 B1 | 3/2013 |
| KR | 10-2013-0129740 A | 11/2013 |
| TW | 201233741 A1 | 8/2012 |
| WO | WO-2007/083654 A1 | 7/2007 |

OTHER PUBLICATIONS

Taiwanese Search Report for 103146423 dated Jun. 26, 2015; Bae, et al.
Chinese Office Action dated Sep. 29, 2017 of the corresponding application,Chinese Patent Application No. 201410779783.8.

* cited by examiner

*Primary Examiner* — Margaret G Moore
(74) *Attorney, Agent, or Firm* — Lee & Morse P.C.

(57) ABSTRACT

A composition for forming a silica based layer and a method for manufacturing a silica based layer, the composition including a silicon-containing compound, the silicon-containing compound including a hydrogenated polysilazane moiety, a hydrogenated polysiloxazane moiety, or a combination thereof, and a solvent, wherein a number of particles of the silicon-containing compound in the composition and having a particle diameter of about 0.2 μm to about 1 μm is less than or equal to about 10/ml.

10 Claims, 6 Drawing Sheets

COMPOSITION FOR FORMING SILICA BASED LAYER, AND METHOD FOR MANUFACTURING SILICA BASED LAYER

CROSS-REFERENCE TO RELATED APPLICATION

Korean Patent Application No. 10-2014-0063293 filed on May 26, 2014, in the Korean Intellectual Property Office, and entitled: "Composition for Forming Silica Based Layer, and Method for Manufacturing Silica Based Layer," is incorporated by reference herein in its entirety.

BACKGROUND

1. Field

Embodiments relate to a composition for forming a silica based layer and a method for manufacturing a silica based layer.

2. Description of the Related Art

Due to accelerating development of semiconductor technologies, a highly-integrated and high-speed semiconductor memory cell having improved performance by increasing integration of a semiconductor chip having a smaller size has been considered. Among these semiconductor memory cells, e.g., DRAM (dynamic random access memory) may be used. The DRAM may be capable of freely inputting and outputting information, and may realize large capacity.

The DRAM may include, e.g., a plurality of unit cells including one MOS transistor and one capacitor. The capacitor may include two electrodes and a dielectric layer therebetween. The capacitor may have various capacities depending on, e.g., a dielectric constant, a thickness of the dielectric layer, an area of the electrodes, and the like.

SUMMARY

Embodiments are directed to a composition for forming a silica based layer and a method for manufacturing a silica based layer.

The embodiments may be realized by providing a composition for forming a silica based layer, the composition including a silicon-containing compound, the silicon-containing compound including a hydrogenated polysilazane moiety, a hydrogenated polysiloxazane moiety, or a combination thereof, and a solvent, wherein a number of particles of the silicon-containing compound in the composition and having a particle diameter of about 0.2 μm to about 1 μm is less than or equal to about 10/ml.

The number of particles of the silicon-containing compound in the composition and having a particle diameter of about 0.2 μm to about 1 μm may be less than or equal to about 8/ml.

The silicon-containing compound may have a weight average molecular weight of about 1,000 to about 200,000.

The silicon-containing compound may include a moiety represented by the following Chemical Formula 1:

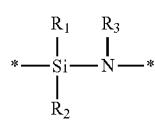

[Chemical Formula 1]

wherein, in the above Chemical Formula 1, $R_1$ to $R_3$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof.

The silicon-containing compound may further include a moiety represented by the following Chemical Formula 2:

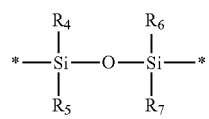

[Chemical Formula 2]

wherein, in the above Chemical Formula 2, $R_4$ to $R_7$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof.

The silicon-containing compound may include a moiety represented by the following Chemical Formula 3 at a terminal end thereof and in an amount of about 15 to about 35 wt %, based on a total amount of a Si—H bond of the silicon-containing compound,

*—SiH$_3$. [Chemical Formula 3]

The silicon-containing compound may have an oxygen content of about 0.2 to about 3 wt %, based on a total weight of the silicon-containing compound.

The silicon-containing compound may include a moiety represented by the following Chemical Formula 3 at a terminal end thereof and in an amount of about 15 to about 35 wt %, based on a total amount of a Si—H bond of the silicon-containing compound,

*—SiH$_3$. [Chemical Formula 3]

The embodiments may be realized by providing a method for manufacturing a silica based layer, the method including coating the composition for forming a silica based layer according to an embodiment on the substrate, drying the substrate coated with the composition for forming a silica based layer, and curing the substrate under an inert atmosphere at a temperature of greater than or equal to about 200° C.

Coating the composition for forming a silica based layer on the substrate may include performing a spin-on coating method.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
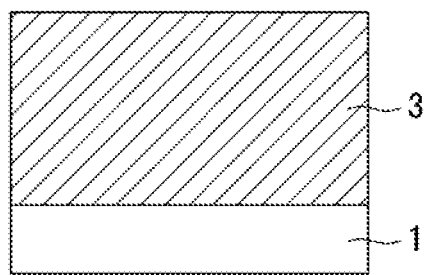
FIGS. 1 to 9 illustrate cross-sectional views of stages in a method for manufacturing a semiconductor capacitor according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, the term 'substituted' refers to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, alkyl group, a C2 to C16 alkenyl group, a C2 to C16 alkynyl group, aryl group, a C7 to C13 arylalkyl group, a C1 to C4 oxyalkyl group, a C1 to C20 heteroalkyl group, a C3 to C20 heteroarylalkyl group, a cycloalkyl group, a C3 to C15 cycloalkenyl group, a C6 to C15 cycloalkynyl group, a heterocycloalkyl group, and a combination thereof, instead of hydrogen of a compound.

As used herein, when a definition is not otherwise provided, the term 'hetero' refers to one including 1 to 3 heteroatoms selected from N, O, S, and P.

In addition, in the specification, the mark "*" refers to where something is connected with the same or different atom or Chemical Formula.

Hereinafter, a composition for forming a silica based layer according to an embodiment is described.

A composition for forming a silica based layer according to an embodiment may include a solvent and a silica based or silicon containing compound. The silicon containing compound may include, e.g., a hydrogenated polysilazane moiety, a hydrogenated polysiloxazane moiety, or a combination thereof.

The composition for forming a silica based layer may include a particle in a liquid state, e.g., a particle that is insoluble and suspended in the liquid state solvent. In an implementation, a number or concentration of particles having a diameter of about 0.2 μm to about 1 μm and, e.g., suspended, in the solvent may be less than or equal to about 10/ml (e.g., 10 undissolved or suspended particles per ml of solvent).

The particles in the composition for forming a silica based layer may be formed in or during a process of synthesizing the composition, and as the number or concentration of the particles is decreased, a number or frequency of defects in the silica based layer may also be decreased.

The composition for forming a silica based layer according to an embodiment may be controlled to include less than, or equal to about 10 particles per one ml of a solution, in order to help reduce the number or frequency of defects in a silica based layer formed therefrom. Thus, performance of the silica based layer may be improved. For example, the particles may have a diameter of about 0.2 μm to about 1 μm.

In an implementation, the number of the particles in the composition, e.g., the concentration, may be counted or measured by using LPC (Liquid Particle Counter) (KS-42BF, RION Co., Ltd.).

In an implementation, the silicon-containing compound may be, e.g., a hydrogenated polysilazane. For example, the silicon-containing compound of the composition for forming a silica based layer may include a moiety represented by the following Chemical Formula 1.

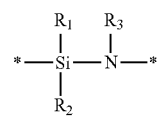

[Chemical Formula 1]

In the above Chemical Formula 1, $R_1$ to $R_3$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof. In an implementation, at least one of $R_1$ to $R_3$ may be hydrogen.

Hydrogenated polysilazane may be prepared by various methods, e.g., by reacting halosilane with ammonia.

The silicon-containing compound may be, e.g., a hydrogenated polysiloxazane. For example, the silicon-containing compound of the composition for forming a silica based layer may further include a moiety represented by the following Chemical Formula 2, e.g., as well as or in addition to the (e.g., polysilazane) moiety represented by the above Chemical Formula 1.

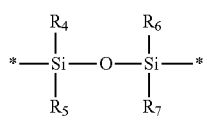

[Chemical Formula 2]

In the above Chemical Formula 2, $R_4$ to $R_7$ may be defined the same as $R_1$ to $R_3$ in the above Chemical Formula 1. In an implementation, at least one of $R_4$ to $R_7$ may be hydrogen.

For example, when the composition further includes the moiety represented by the above Chemical Formula 2, the silicon-containing compound (e.g., hydrogenated polysiloxazane) prepared according to the embodiment may include a silicon-oxygen-silicon (Si—O—Si) bond moiety other than or in addition to a silicon-nitrogen (Si—N) bond moiety in its structure or backbone. The silicon-oxygensilicon (Si—O—Si) bond moiety may help weaken or reduce stress during curing by a heat treatment and may help reduce contraction.

In an implementation, the silicon-containing compound (e.g., hydrogenated polysiloxazane) may have an oxygen content of about 0.2 to about 3 wt %, based on a total weight of the silicon-containing compound. When the oxygen is included within the range, the silicon-oxygen-silicon (Si—O—Si) in the silicon-containing compound, e.g., structure of the hydrogenated polysiloxazane, may sufficiently weaken or reduce stress and may help prevent its contraction during a heat treatment. Thus, generation of a crack in a pattern according to the treatment may be reduced and/or prevented.

In an implementation, the oxygen content may be, e.g., about 0.4 to about 2 wt %.

The oxygen content may be measured by using FlashEA 1112 (Thermo Fisher Scientific Inc.), a $SiH_3$/SiH (total), described below, may be measured by using proton NM of 200 MHz: AC-200 (Bruker Co.), and a weight average molecular weight, described below, may be measured by using GPC; HPLC Pump 1515, RI Detector 2414 (Waters Co.) and Column: KF801, KF802, KF803 (Shodex).

In an implementation, the silicon-containing compound, e.g., the hydrogenated polysilazane or hydrogenated polysiloxazane, of the composition for forming a silica based layer may include a moiety represented by the following Chemical Formula 3 at a terminal end thereof.

   *—$SiH_3$   [Chemical Formula 3]

The moiety represented by the above Chemical Formula 3 is a structure where the terminal end is sapped or capped with hydrogen, and may be included in an amount of about 15 to about 35 wt %, based on a total amount of the Si—H bond of the silicon-containing compound, e.g., the hydrogenated polysilazane or hydrogenated polysiloxazane structure. When the moiety of the above Chemical Formula 3 is included in the silicon-containing compound, e.g., the hydrogenated polysilazane or hydrogenated polysiloxazane structure, within the range, a $SiH_3$ moiety may be prevented from being scattered or separated into $SiH_4$ while an oxidation reaction sufficiently occurs during the heat treatment, and a crack in a filler pattern may be prevented.

The prepared silicon-containing compound, e.g., the hydrogenated polysilazane or hydrogenated polysiloxazane, may have a weight average molecular weight (Mw) of about 1,000 to about 200,000. Within the range, less components (e.g., a smaller amount of the silicon-containing compound) may be evaporated during the heat treatment. In an implementation, the silicon-containing compound (e.g., the hydrogenated polysilazane or hydrogenated polysiloxazane) may have a weight average molecular weight of, e.g., about 3,000 to about 200,000.

The silicon-containing compound may be included in the composition in an amount of about 0.1 to about 50 wt %, based on a total weight of the composition for forming a silica based layer. When the silicon-containing compound is included within the range, an appropriate viscosity may be maintained and a flat and uniform layer with no gap (e.g., void) may be prepared.

The prepared silicon-containing compound (e.g., the hydrogenated polysilazane or hydrogenated polysiloxazane) may be dissolved and/or dispersed in the solvent to form the composition for forming a silica based layer.

The composition for forming a silica based layer may further include a thermal acid generator (TAG).

The thermal acid generator may be an additive to help improve developing properties of the composition for forming a silica based layer. For example, the thermal acid generate may facilitate development of composition or the silicon-containing compound at a relatively low temperature.

The thermal acid generator may include a suitable compound that generates acid ($H^+$) by heat. For example, the thermal acid generator may include a compound that is activated at 90° C. or higher, that generates sufficient acid, and that has low volatility.

The thermal acid generator may include, e.g., a compound represented by the following Chemical Formula 4.

   $R^5_4N^+Y$   [Chemical Formula 4]

In the above Chemical Formula 4, $R^5$ may be a substituted or unsubstituted C1 to C20 alkyl group, a cycloalkyl group, an aromatic group, or a combination thereof.

Y may be $NO_3^-$, $OH^-$, or a combination thereof.

The thermal acid generator may include, e.g., nitrobenzyl tosylate, nitrobenzyl benzenesulfonate, phenol sulfonate, or a combination thereof.

The thermal acid generator may be included in the composition in an amount of about 0.01 to about 25 wt %, based on the total weight of the composition for forming a silica based layer. Within the range, the composition or the silicon-containing compound may be developed at a low temperature and simultaneously, may have improved coating properties.

The composition for forming a silica based layer may further include a surfactant.

The surfactant may include, e.g., a non-ionic surfactant such as polyoxyethylene alkyl ethers such as polyoxyethylene lauryl ether, polyoxyethylene stearyl ether, polyoxyethylene cetyl ether, polyoxyethylene oleyl ether, and the like, polyoxyethylene alkylallyl ethers such as polyoxyethylenenonyl phenol ether, and the like, polyoxyethylene•polyoxypropylene block copolymers, polyoxyethylene sorbitan fatty acid ester such as sorbitan monolaurate, sorbitan monopalmitate, sorbitan monostearate, sorbitan monoleate, polyoxyethylene sorbitan monostearate, polyoxyethylene sorbitan trioleate, polyoxyethylene sorbitan tristearate, and the like; a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and the like; other silicone-based surfactant such as a organosiloxane polymer KP341 (Shin-Etsu Chemical Co., Ltd.), or the like.

The surfactant may be included in the composition in an amount of about 0.001 to about 10 wt %, based on the total weight of the composition for forming a silica based layer. Within the range, dispersion of a solution and simultaneously, uniform thickness of a layer may be improved.

The composition for forming a silica based layer may be a solution obtained by dissolving and/or dispersing the silicon-containing compound (and any other components) in a solvent. The prepared silicon-containing compound (e.g., hydrogenated polysilazane or hydrogenated polysiloxazane) may be dissolved and/or dispersed in a suitable solvent, preparing a solution or a composition for gap-filling a semiconductor.

The solvent, e.g., coating solvent, may be selected by considering conservation stability, a drying rate, or the like, e.g., an organic solvent having a boiling point of about 50 to about 200° C. For example, an aromatic compound, an aliphatic compound, a saturated hydrocarbon compound, ethers, esters, ketones, or the like may be used. In an implementation, the solvent may be selected from, e.g., benzene, toluene, xylene, ethylbenzene, diethylbenzene, trimethylbenzene, triethylbenzene, cyclohexane, cyclohexene, decahydronaphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, and a combination thereof.

According to another embodiment, a method for manufacturing a silica based layer may include coating the composition for forming a silica based layer on a substrate; drying the substrate (that has been coated with the composition for forming a silica based layer); and curing the resultant under an inert gas atmosphere at a temperature of greater than or equal to about 200° C.

In an implementation, the composition for forming a silica based layer may be coated using a solution process such as a spin-on coating method.

The substrate may be, e.g., a device substrate such as a semiconductor, a liquid crystal, or the like.

According to another embodiment, an electronic device including the silica based layer manufactured according to the method may be provided. The electronic device may be, e.g., a display device such as LCD or LED, or a semiconductor device, and the silica based layer may be an insulation layer or a filling layer of the electronic device.

According to yet another embodiment, a method for manufacturing a semiconductor capacitor and a semiconductor capacitor manufactured according to the method may be provided. Hereinafter, referring to FIGS. 1 to 9, the method for manufacturing a semiconductor capacitor and a semiconductor capacitor manufactured are described.

FIGS. 1 to 9 illustrate a cross-sectional views of stages in a method for manufacturing a semiconductor capacitor according to an embodiment.

Referring to FIG. 1, a mold oxide layer 3 may be disposed on a semiconductor substrate 1. The semiconductor substrate 1 may include thereon, e.g., a transistor (not shown), a contact pad (not shown), a contact plug (not shown), or the like. The mold oxide layer 3 may be made of, e.g., an oxide such as silicon oxide ($SiO_2$), TEOS (tetraethylothosilicate), BPSG (boron phosphorus silicate glass), and PSG (phosphor silicate glass), by, e.g., a chemical vapor deposition (CVD) method.

Figure 2:
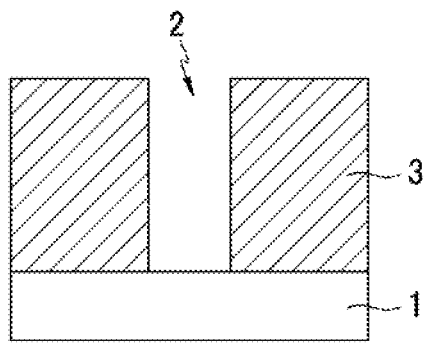

Referring to FIG. 2, a gap 2 (revealing a contact plug on the semiconductor substrate 1) may be formed by performing a photolithography process on the mold oxide layer 3. The gap 2 may be or may have a dimension that is, e.g., less than 50 nm. The gap 2 may have an aspect ratio of more than 1 (between height and width).

Figure 3:
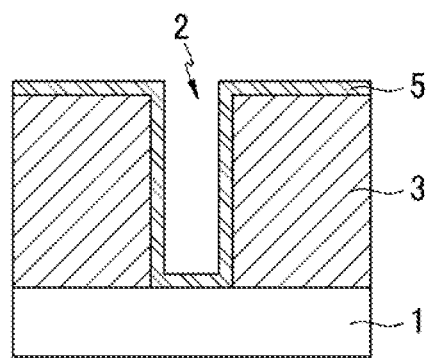

Referring to FIG. 3, a conductive layer 5 may be laminated on the semiconductor substrate 1 and the mold oxide layer 3. The conductive layer 5 may be a single layer or multilayer. The conductive layer 5 may be made of or may include, e.g., a metal with low resistivity such as aluminum (Al), copper (Cu), silver (Ag), and an alloy thereof, a metal such as nickel (Ni), titanium (Ti), and the like, polysilicon, or the like. The conductive layer 5 may be formed by, e.g., a sputtering method, a chemical vapor deposition (CVD) method, or the like.

Figure 4:
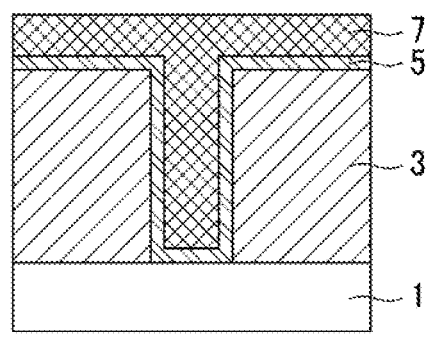

Referring to FIG. 4, a filling layer 7 may be formed on the conductive layer 5. The filling layer 7 may be a silica or silica based layer made of or prepared from a composition according to an embodiment, e.g., including the silicon-containing compound (e.g., hydrogenated polysilazane or hydrogenated polysiloxazane). For example, the silica based layer may be the same as described above. The composition may be mixed with or may already include the coating solvent to provide a solution or composition. The composition may be coated by a solution process, e.g., a spin coating.

Subsequently, the filling layer 7 may be heat-treated. The heat-treating may be performed at about 200° C. or higher, e.g., under a water or vapor-containing atmosphere.

Figure 5:
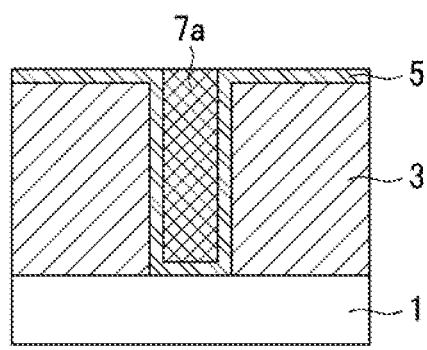

Referring to FIG. 5, the filling layer 7 may be developed using a developing solution. Accordingly, a portion of the filling layer 7 on the conductive layer 5 may removed, leaving a part or portion that fills the gap 2, thereby forming a predetermined filler pattern 7a.

Figure 6:
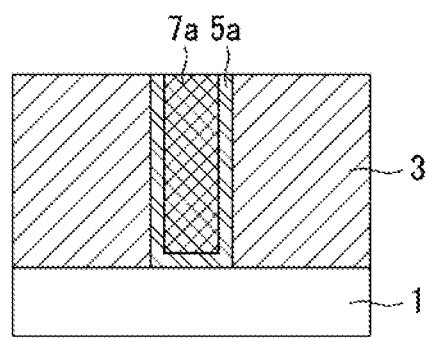

Referring to FIG. 6, portions of the conductive layer 5 on the mold oxide layer 3 may be removed to form a lower electrode 5a. For example, a part or portion of the conductive layer that is between the mold oxide layer 3 and the filler pattern 7a may remain to provide the lower electrode 5a with a predetermined shape. In an implementation, the portions of the conductive layer 5 may be removed by a chemical mechanical polishing (CMP) method or an etch back method.

Figure 7:
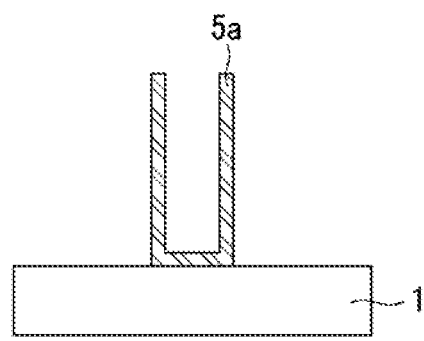

Referring to FIG. 7, the mold oxide layer 3 and the filler pattern 7a may be simultaneously removed, leaving the lower electrode 5a. The mold oxide layer 3 and the filler pattern 7a may be removed by a wet etching method. In an implementation, the wet etching method may use an etchant or etching solution that simultaneously removes the mold oxide layer 3 and the filler pattern 7a. For example, the etchant may include a fluorine-containing etching solution such as hydrofluoric acid (HF) and/or ammonium fluoride ($NH_4F$).

Figure 8:
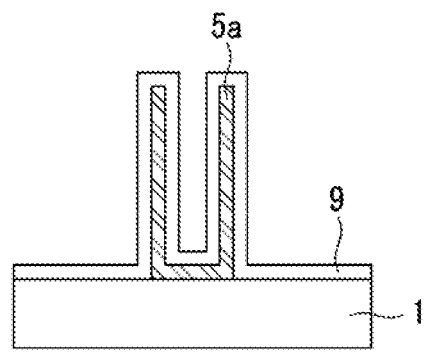

Referring to FIG. 8, a dielectric layer 9 may be on an entire surface of the substrate 1 and the lower electrode 5a.

Figure 9:
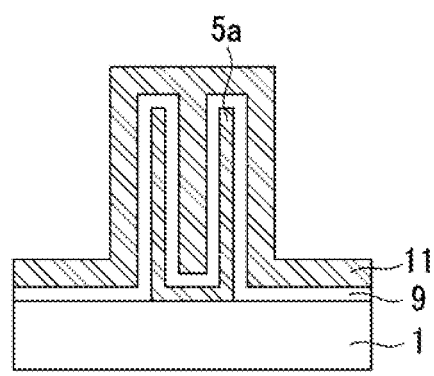

Referring to FIG. 9, an upper electrode 11 may be formed by laminating a conductive layer on the dielectric layer 9 and then performing a photolithography process.

The lower electrode 5a, the dielectric layer 9, and the upper electrode 11 may form a capacitor.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Comparative Example 1

A 2 L reactor (equipped with an agitator and a temperature controller) was internally substituted with dry nitrogen. Subsequently, 1,500 g of dry pyridine was injected into the reactor, and the reactor was kept at 5° C. Then, 140 g of dichlorosilane was slowly injected thereinto over 2 hours. Then, 85 g of ammonia was slowly injected thereinto, while the reactor was agitated for 4 hours. Then, dry nitrogen was injected thereinto for 120 minutes, and ammonia remaining in the reactor was removed. The obtained white slurry-phased product was filtered through a 1 μm TEFLON (tetrafluoroethylene) filter under a dry nitrogen atmosphere, obtaining 1,000 g of a filtered solution. Then, 1,000 g of dry xylene was added to the filtered solution, the xylene in the mixture was substituted with pyridine three times by using a rotary evaporator to adjust a solid concentration therein to 20%, and the obtained mixture was filtered with a TEFLON filter having a pore size of 0.1 μm. Then, 250 g of dry pyridine was added to the obtained hydrogenated polysilazane solution, and the mixture was polymerized at 100° C., until its weight average molecular weight reached about 3,000.

When the polymerization was terminated, the solvent of the product was substituted with dibutylether at 30° C. three times by using a rotary evaporator to adjust its solid concentration into 20%, and the obtained mixture was filtered with a 0.1 μm TEFLON filter, obtaining hydrogenated polysiloxazane.

Example 1

A 2 L reactor (equipped with an agitator and temperature controller) was internally substituted with dry nitrogen. Subsequently, 1,500 g of dry pyridine was injected into the reactor, and the reactor was kept at 5° C. Then, 140 g of dichlorosilane was slowly injected thereinto over 2 hours. Then, 85 g of ammonia was slowly injected thereinto over 4 hours while the reactor was agitated. Then, dry nitrogen was injected thereinto for 120 minutes, and ammonia remaining therein was removed. The obtained white slurry-phased product was filtered with a 1 μm TEFLON filter under a dry nitrogen atmosphere, obtaining 1,000 g of a filtered solution. Then, 1,000 g of dry xylene was added thereto, the xylene in the mixture was substituted with pyridine three times by using a rotary evaporator to adjust its solid concentration to 20%, and the obtained mixture was filtered with a TEFLON filter having a pore size of 0.1 μm. Then, 250 g of dry pyridine was added to the obtained hydrogenated polysilazane solution, and the mixture was polymerized at 100° C. until its weight average molecular weight reached about 4,500.

When the polymerization was terminated, the solvent of the product was substituted with dibutylether at 30° C. three times by using a rotary evaporator to adjust its solid concentration to 20%, and the obtained mixture was filtered with a 0.1 μm TEFLON filter, obtaining hydrogenated polysiloxazane.

Example 2

A 2 L reactor (equipped with an agitator and a temperature controller) was internally substituted with dry nitrogen. Subsequently, 1,500 g of dry pyridine was injected into the reactor, and the reactor was kept at 5° C. Then, 140 g of dichlorosilane was slowly injected thereinto over 2 hours. Then, 85 g of ammonia was slowly injected thereinto over 4 hours, while the reactor was agitated. Then, dry nitrogen was injected thereinto for 120 minutes, and the ammonia remaining in the reactor was removed. The obtained white slurry-phased product was filtered with a 1 μm TEFLON filter under a dry nitrogen atmosphere, obtaining 1,000 g of a filtered solution. Then, 1,000 g of dry xylene was added thereto, the xylene in the mixture was substituted with pyridine three by using a rotary evaporator to adjust its solid concentration to 20%, and the obtained mixture was filtered with a TEFLON filter having a pore size of 0.1 μm. Then, 250 g of dry pyridine was added to the obtained hydrogenated polysilazane solution, and the mixture was polymerized at 100° C. until its weight average molecular weight reached about 7,000.

When the polymerization was terminated, a solvent in the product was substituted with dibutylether at 30° C. three times by using a rotary evaporator to adjust its solid concentration to 20%, and the obtained solution was filtered with a 0.1 μm TEFLON filter, obtaining hydrogenated polysiloxazane.

Example 3

A 2 L reactor (equipped with an agitator and a temperature controller) was internally substituted with dry nitrogen. Subsequently, 1,500 g of dry pyridine was injected into the reactor, and the reactor was kept at 5° C. Then, 140 g of dichlorosilane was slowly injected thereinto over 2 hours. Then, 85 g of ammonia was slowly injected thereinto over 4 hours, while the reactor was agitated. Then, dry nitrogen was injected thereinto over 120 minutes, and ammonia remaining in the reactor was removed. The obtained white slurry-phased product was filtered with a 1 μm TEFLON filter under a dry nitrogen atmosphere, obtaining 1,000 g of a filtered solution. Then, 1,000 g of dry xylene was added thereto, the xylene therein was substituted with pyridine three times by using a rotary evaporator to adjust its solid concentration to 20%, and the obtained mixture was filtered with a TEFLON filter having a pore size of 0.1 μm. Then, 250 g of dry pyridine was added to the obtained hydrogenated polysilazane solution, and the mixture was polymerized at 100° C. until its weight average molecular weight reached about 22,000.

When the polymerization was terminated, a solvent in the product was substituted with dibutylether 30° C. three times by using a rotary evaporator to adjust its solid concentration to 20%, and the obtained mixture was filtered with a 0.1 μm TEFLON filter, obtaining hydrogenated polysiloxazane.

Example 4

A 2 L reactor (equipped with an agitator and a temperature controller) was internally substituted with dry nitrogen. Subsequently, 1,500 g of dry pyridine was injected into the reactor, and the reactor was kept at 5° C. Then, 140 g of dichlorosilane was slowly injected thereinto over 2 hours. Then, 85 g of ammonia was slowly injected thereinto over 4 hours, while the reactor was agitated. Then, dry nitrogen was injected thereinto over 120 minutes, and ammonia remaining in the reactor was removed. The obtained white slurry-phased product was filtered with a 1 μm TEFLON filter under a dry nitrogen atmosphere, obtaining 1,000 g of a filtered solution. Then, 1,000 g of dry xylene was added thereto, the xylene in the mixture was substituted with pyridine three times by using a rotary evaporator to adjust its solid concentration to 20%, and the obtained mixture was filtered with a TEFLON filter having a pore size of 0.1 μm. Then, 250 g of dry pyridine was added to the obtained hydrogenated polysilazane solution, and the mixture was polymerized 100° C. until its weight average molecular weight reached about 40,000.

When the polymerization was terminated, a solvent in the product was substituted with dibutylether at 30° C. three times by using a rotary evaporator to adjust its solid concentration to 20%, and the obtained mixture was filtered with a 0.1 μm TEFLON filter.

Example 5

A 2 L reactor (equipped with an agitator and a temperature controller) was internally substituted with dry nitrogen. Subsequently, 1,500 g of dry pyridine was injected into the reactor, and the reactor was kept at 5° C. Then, 140 g of dichlorosilane was slowly injected thereinto over 2 hours.

Then, 85 g of ammonia was injected thereinto over 4 hours while the reactor was agitated. Then, dry nitrogen was injected thereinto for 120 minutes, and ammonia remaining in the reactor was removed. The obtained white slurry-phased product was filtered with a 1 μm TEFLON filter under a dry nitrogen atmosphere, obtaining 1,000 g of a filtered solution. Then, 1,000 g of dry xylene was added thereto, the xylene in the mixture was substituted with pyridine three times by using a rotary evaporator to adjust its solid concentration to 20%, and obtained mixture was filtered with a 0.1 μm TEFLON filter. Then, 250 g of dry pyridine was added to the obtained hydrogenated polysilazane solution, and the mixture was polymerized at 100° C. until its weight average molecular weight reached about 100,000.

When the polymerization was terminated, a solvent in the product was substituted with dibutylether at 30° C. three times by using a rotary evaporator to adjust its solid concentration to 20%, and the obtained mixture was filtered with a 0.1 μm TEFLON filter, obtaining hydrogenated polysiloxazane.

Example 6

A 2 L reactor (equipped with an agitator and a temperature controller) was internally substituted with dry nitrogen. Subsequently, 1,500 g of dry pyridine was injected into the reactor and kept at 5° C. Then, 140 g of dichlorosilane was slowly injected thereinto over 2 hours. Then, 85 g of ammonia was slowly injected thereinto over 4 hours while the reactor was agitated. Then, dry nitrogen was injected thereinto for 120 minutes, and ammonia remaining in the reactor was removed. The obtained white slurry-phased product was filtered with a 1 μm TEFLON filter under a dry nitrogen atmosphere, obtaining 1,000 g of a filtered solution. Then, 1,000 g of dry xylene was added thereto, the xylene was substituted with pyridine three times by using a rotary evaporator to adjust its solid concentration to 20%, and the obtained mixture was filtered with a 0.1 μm TEFLON filter. Then, 250 g of dry pyridine was added to the obtained hydrogenated polysilazane solution, and the mixture was polymerized at 100° C. until its weight average molecular weight reached about 200,000.

When the polymerization was terminated, a solvent in the product was substituted with dibutylether at 30° C. three times by using a rotary evaporator to adjust its solid concentration to 20%, and the obtained mixture was filtered with a 0.1 μm TEFLON filter, obtaining hydrogenated polysiloxazane.

Reactivity of the compositions according to Comparative Example 1 and Examples 1 to 6, and the number or concentration of particles therein were evaluated. The evaluation was performed in the following method.

[TMAH Reactivity Evaluation Method]

3 ml samples of the compositions of Comparative Example 1 and Examples 1 to 6 were respectively dropped in the center of a wafer having a diameter of 8 inches with a spin coater (MS-A200, MIKASA Co., Ltd.), spin-coated at 1,500 rpm for 20 seconds, and heated and dried at 75° C. for 3 minutes. Then, a thickness of each film was measured by using a reflection spectroscopic film thickness meter and a reflection spectroscopic wafer contraction meter and then, measured again by using a reflection spectroscopic film thickness meter (ST-4000, K-MAC) after dipping the film in TMAH (tetramethyl ammonium hydroxide) for 1 minute and washing it with pure water.

The reactivity of the film was obtained according to the following Calculation Equation 1.

TMAH WER (TMAH Wet etch rate)=(decreased film thickness after baking at 75° C. for 3 minutes and dipping in TMAH for 1 minute)/ (weight average molecular weight) (ΔÅ/Mw)     [Calculation Equation 1]

[Evaluation of the Number of Particle]

The number of particles (concentration) in a composition was counted by using LPC (Liquid Particle Counter) (KS-42BF, RION Co., Ltd.). Specifically, 10 ml samples of the compositions according to Comparative Example 1 and Examples 1 to 6 were respectively purged three times with a dibutyl ether (DBE) solution. Then, the resulting compositions were respectively put in a 100 ml bottle and then, purged three times again. Then, the number of particles in the compositions was counted five times, and the measurement values at the 3rd to 5th counting were averaged. Herein, the particles having a size (a particle diameter) ranging from about 0.2 μm to 1 μm were regarded as a valid particle for counting.

The evaluation results are provided in the following Table 1 and FIG. 10.

TABLE 1

| | Mw | TMAH WER WER(ΔÅ)/Mw | LPC ea/ml |
|---|---|---|---|
| Comparative Example 1 | 3,000 | 138 | 13.4 |
| Example 1 | 4,500 | 100 | 8.6 |
| Example 2 | 7,000 | 70 | 7.4 |
| Example 3 | 22,000 | 29 | 4.4 |
| Example 4 | 40,000 | 16 | 2.9 |
| Example 5 | 100,000 | 6 | 1.2 |
| Example 6 | 200,000 | 3 | 0.7 |

Figure 10:
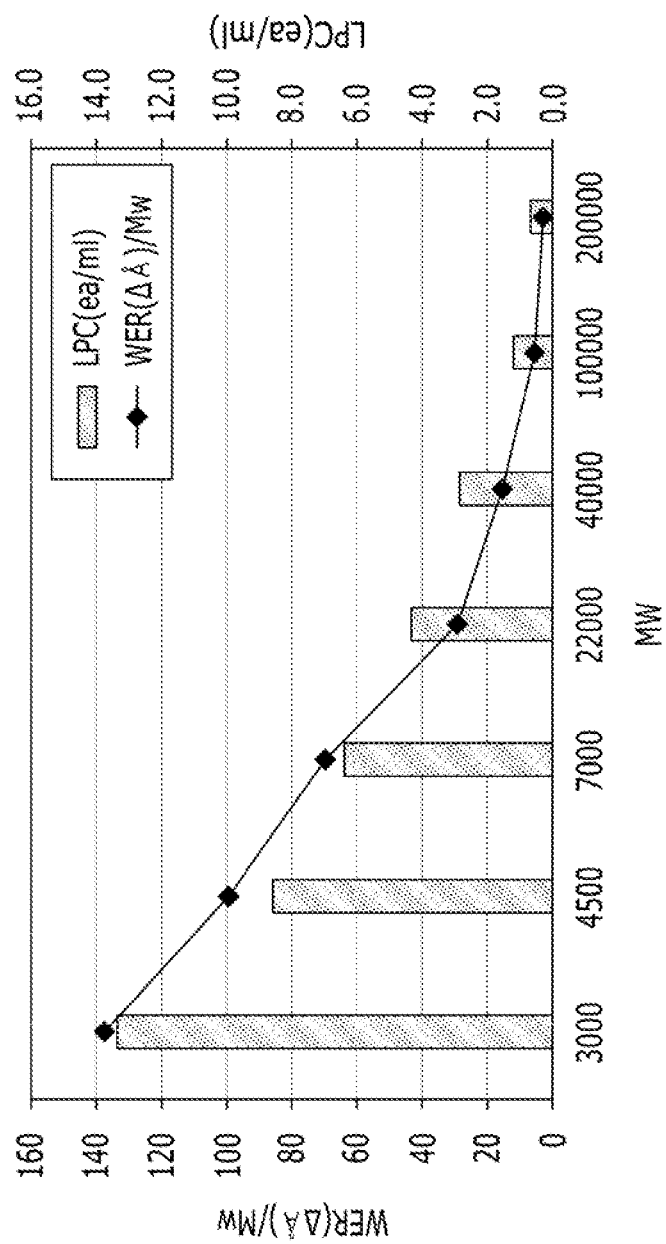
FIG. 10 illustrates a graph showing a number of particles in compositions according to Comparative Example 1 and Examples 1 to 6, and a TMAH reactivity result of each layer respectively formed using the compositions.

FIG. 10 illustrates a graph showing the number of particles in each composition according to Comparative Example 1 and Examples 1 to 6, and TMAH reactivity result of the layers respectively prepared from the compositions.

Referring to Table 1 and FIG. 10, the layers prepared from the compositions including less than or equal to 10 particles (having a diameter of about 0.2 μm to 1 μm) per ml (e.g., according to Examples 1 to 6) showed relatively lower TMAH reactivity, as the silicon-containing compounds (e.g., hydrogenated polysiloxazane) in the compositions had a larger molecular weight.

By way of summation and review, as a size of a semiconductor chip is reduced, the size of the capacitor therein may also be reduced. However, a smaller capacitor may still need sufficient storage capacity. The capacitor may accomplish bigger capacity by, e.g., increasing a vertical area instead of decreasing a horizontal area to increase overall active area. When this method is used to manufacture the capacitor, a silica based layer (formed by using a mold and filling a gap on the mold with a composition for forming the silica based layer) may be used to help effectively form relatively higher electrodes than narrow horizontal area.

The embodiments may provide a composition for forming a silica based layer that is capable of minimizing a defect.

The composition for forming a silica based layer according to an embodiment may reduce production of a particle and thus, may minimize a defect in a layer formed thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

1: semiconductor substrate
2: gap
3: mold oxide layer
5: conductive layer
7: filling layer
7a: filler pattern
5a: lower electrode
9: dielectric layer
11: upper electrode

What is claimed is:

1. A composition for forming a silica based layer, the composition comprising:
a silicon-containing compound, the silicon-containing compound including a hydrogenated polysilazane moiety, a hydrogenated polysiloxazane moiety, or a combination thereof, and
a solvent, wherein:
a number of particles of the silicon-containing compound in the composition and having a particle diameter of about 0.2 µm to about 1 µm is less than or equal to 10/ml,
the silicon-containing compound has a weight average molecular weight of about 22,000 to about 200,000, and
the composition provides a film having a tetramethyl ammonium hydroxide (TMAH) wet etch rate of 100 or below as calculated according to the following Calculation Equation 1:

TMAH wet etch rate=decreased film thickness in Å/weight average molecular weight.[Calculation Equation 1]

2. The composition for forming a silica based layer as claimed in claim 1, wherein the number of particles of the silicon-containing compound in the composition and having a particle diameter of about 0.2 µm to about 1 µm is less than or equal to about 8/ml.

3. The composition for forming a silica based layer as claimed in claim 1, wherein the silicon-containing compound includes a moiety represented by the following Chemical Formula 1:

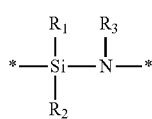

[Chemical Formula 1]

wherein, in the above Chemical Formula 1, $R_1$ to $R_3$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof.

4. The composition for forming a silica based layer as claimed in claim 3, wherein the silicon-containing compound further includes a moiety represented by the following Chemical Formula 2:

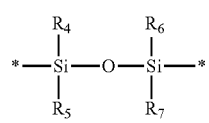

[Chemical Formula 2]

wherein, in the above Chemical Formula 2, $R_4$ to $R_7$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof.

5. The composition for forming a silica based layer as claimed in claim 4, wherein the silicon-containing compound includes a moiety represented by the following Chemical Formula 3 at a terminal end thereof and in an amount of about 15 to about 35 wt %, based on a total amount of a Si—H bond of the silicon-containing compound,

*—SiH₃. [Chemical Formula 3]

6. The composition for forming a silica based layer as claimed in claim 4, wherein the silicon-containing compound has an oxygen content of about 0.2 to about 3 wt %, based on a total weight of the silicon-containing compound.

7. The composition for forming a silica based layer as claimed in claim 3, wherein the silicon-containing compound includes a moiety represented by the following Chemical Formula 3 at a terminal end thereof and in an amount of about 15 to about 35 wt %, based on a total amount of a Si—H bond of the silicon-containing compound,

*—SiH₃. [Chemical Formula 3]

8. A method for manufacturing a silica based layer, the method comprising:
coating the composition for forming a silica based layer as claimed in claim 1 on the substrate,
drying the substrate coated with the composition for forming a silica based layer, and
curing the substrate under an inert atmosphere at a temperature of greater than or equal to about 200° C.

9. The method as claimed in claim 8, wherein coating the composition for forming a silica based layer on the substrate includes performing a spin-on coating method.

10. The composition for forming a silica based layer as claimed in claim 1, wherein, when a 10 ml sample of the composition is purged three times with a dibutyl ether (DBE) solution, then the resulting composition is put in a 100 ml bottle and then purged three times again, the number of particles of the silicon-containing compound in the composition and having a particle diameter of about 0.2 µm to about 1 µm is less than or equal to 10/ml.

\* \* \* \* \*